(12) United States Patent
Nagorny et al.

(10) Patent No.: US 9,214,319 B2
(45) Date of Patent: Dec. 15, 2015

(54) HIGH EFFICIENCY PLASMA SOURCE

(75) Inventors: Vladimir Nagorny, Tracy, CA (US); Charles Crapuchettes, Santa Clara, CA (US)

(73) Assignee: Mattson Technology, Inc., Fremont, CA (US)

( * ) Notice: Subject to any disclaimer, the term of this patent is extended or adjusted under 35 U.S.C. 154(b) by 0 days.

(21) Appl. No.: 14/239,201

(22) PCT Filed: Jul. 30, 2012

(86) PCT No.: PCT/US2012/048790
§ 371 (c)(1),
(2), (4) Date: Feb. 17, 2014

(87) PCT Pub. No.: WO2013/028313
PCT Pub. Date: Feb. 28, 2013

(65) Prior Publication Data
US 2014/0197136 A1    Jul. 17, 2014

Related U.S. Application Data

(60) Provisional application No. 61/525,475, filed on Aug. 19, 2011.

(51) Int. Cl.
*H01L 21/00*    (2006.01)
*C23C 16/00*    (2006.01)
(Continued)

(52) U.S. Cl.
CPC .......... *H01J 37/321* (2013.01); *H01J 37/3244* (2013.01); *H01J 37/32357* (2013.01); *H05H 1/46* (2013.01); *H05H 2001/4667* (2013.01)

(58) Field of Classification Search
CPC ............... H01J 37/321; H01J 37/3211; H01J 37/32119; H01J 37/32128; H01J 37/32137; H01J 37/32146; H01J 37/32155; H01J 37/32165; H01J 37/32174; H01J 37/32183

USPC ....... 118/723 I, 723 IR, 723 AN; 156/345.48, 156/345.49; 315/111.51
See application file for complete search history.

(56) References Cited

U.S. PATENT DOCUMENTS 6,553,933 B2    4/2003   Powell et al.
2003/0015293 A1* 1/2003  Obuchi ................ 156/345.48
(Continued)

FOREIGN PATENT DOCUMENTS

WO    WO 2007-038514    4/2007
WO    WO 2008-156794    12/2008
(Continued)

OTHER PUBLICATIONS

International Search Report from PCT/US2012/048790—3 pp.

*Primary Examiner* — Luz Alejandro Mulero
(74) *Attorney, Agent, or Firm* — Dority & Manning, P.A.

(57) ABSTRACT

A plasma reactor and method for improved gas injection for an inductive plasma source for dry strip plasma processing are disclosed. According to embodiments of the present disclosure, gas is fed into a plasma chamber through a gas injection channel located adjacent to the side wall of the plasma chamber, rather than from the center, so that the process gas enters the plasma chamber in a close proximity to the induction coil. In particular embodiments, the process gas that enters the chamber is forced to pass through a reactive volume or active region adjacent the induction coil where efficient heating of electrons occurs, providing increased efficiency of the reactor by improving process gas flow and confinement in the heating area.

17 Claims, 7 Drawing Sheets

(51) Int. Cl.
*H01J 37/32* (2006.01)
*H05H 1/46* (2006.01)

(56) References Cited

U.S. PATENT DOCUMENTS

2003/0111963 A1* 6/2003 Tolmachev et al. ...... 315/111.51
2005/0093460 A1* 5/2005 Kim et al. ................. 315/111.21
2012/0006490 A1* 1/2012 Yamamoto et al. ...... 156/345.48

FOREIGN PATENT DOCUMENTS

WO   WO 2009-089245        7/2009
WO   WO 2010/113358     * 10/2010

* cited by examiner

HIGH EFFICIENCY PLASMA SOURCE

FIELD

The present disclosure relates generally to plasma generation and, more particularly, to an increased efficiency plasma source that can be used, for instance, for dry strip plasma processes.

BACKGROUND

Plasma processing is widely used in the semiconductor industry for deposition, etching, resist removal, and related processing of semiconductor wafers and other substrates. Inductive plasma sources are often used for plasma processing to produce high density plasma and reactive species for processing wafers. For instance, inductive plasma sources can easily produce high density plasma using standard 13.56 MHz and lower frequency power generators. Inductive plasma sources combined with RF bias have also been used in etchers, for example, to provide independent control of ion energy and ion flux to the wafer.

For certain plasma processes such as a dry strip process for resist removal, it is not desirable to expose the semiconductor wafers directly to the plasma. In these processes, a plasma source is used mainly as an intermediate for modification of a gas composition and to create some chemically active radicals for processing wafers. The plasma is formed remotely from the processing chamber and desired particles are channeled to the semiconductor wafer for example through a grid that is transparent to neutral particles and not transparent to the plasma.

Because rates of processes on the wafer are directly proportional to the rate with which these new species are created and delivered to the surface of the wafer, these processes typically require high RF power (e.g. about 3-5 kW) and in some cases high gas flows (e.g. about 5-25 slm) and high pressure (e.g. about 1000 mTorr). When gas and energy consumption demands are that high, the efficiency of the plasma source becomes increasingly important. Efficiency of the plasma source affects both capital and operational costs. In addition, as a trend of newer and more restrictive government regulations on energy and toxic gas consumption continues, efficiency for both gas and energy consumption will become a more determining characteristic of a plasma source.

Control of the process profile on the wafer is also an important feature of plasma sources. Achieving a good profile, however, often conflicts with achieving increased efficiency. Typical gas injection systems do not provide a high efficiency of gas utilization and create a complicated flow profile that is difficult to control. For example, plasma sources with plasma injection in the center can have a high efficiency of gas utilization, but the profile can be very centered.

Thus, a need exists for a more efficient plasma source that can be used for dry strip processes and other processes where direct plasma interaction with the wafer is undesirable. An efficient plasma source that provides for process profile control across the wafer without change of the hardware would be particularly useful.

SUMMARY

Aspects and advantages of the invention will be set forth in part in the following description, or may be obvious from the description, or may be learned through practice of the invention.

One exemplary aspect of the present disclosure is directed to a plasma reactor for processing a substrate. The plasma reactor includes a processing chamber having a substrate holder operable to hold the substrate. The plasma reactor includes a plasma chamber separate from the processing chamber for generating a plasma to be used in processing the substrate. The plasma chamber has a dielectric side wall and a plasma chamber interior. The plasma reactor further includes an induction coil adjacent the plasma chamber about the dielectric side wall and a gas injection insert disposed within the plasma chamber interior. The gas injection insert and the side wall define a narrow gas injection channel adjacent the dielectric side wall for providing a process gas to the plasma chamber interior proximate the induction coil. In a particular implementation of this exemplary embodiment, the gas injection insert defines an active region with enhanced electron confinement adjacent the induction coil for heating of electrons. The narrow gas injection channel provides the process gas to the active region.

Another exemplary aspect of the present disclosure is directed to a method for generating a plasma for processing a substrate. The method includes placing a substrate in a processing chamber. The processing chamber is separate from a plasma chamber for generating a plasma to be used in processing the substrate. The method further includes energizing an induction coil located adjacent a dielectric sidewall of the plasma chamber to generate a substantially inductive plasma in a plasma chamber interior. The method further includes providing process gas to the plasma chamber interior proximate the induction coil through a narrow gas injection channel defined by the sidewall of plasma chamber and a gas injection insert disposed in the plasma chamber interior.

A further exemplary aspect of the present disclosure is directed to a plasma reactor for processing a substrate. The plasma reactor includes a processing chamber having a substrate holder operable to hold the substrate and a plasma chamber separate from the processing chamber for generating a plasma to be used in processing the substrate. The plasma chamber includes a dielectric side wall and a plasma chamber interior. The plasma reactor further includes an induction coil adjacent the plasma chamber about the dielectric side wall and a gas injection insert disposed within plasma chamber interior. The gas injection insert and the side wall define a narrow gas injection channel adjacent the dielectric side wall for providing a process gas to the plasma chamber interior proximate the induction coil. The gas injection insert further defines an active region for enhanced confinement of electrons adjacent the induction coil. The narrow gas injection channel provides the process gas to the active region adjacent the coil for actively heating electrons in the process gas. The narrow gas injection channel has a width in the range of about 1 mm to about 3 mm and a length in the range of about 1 cm to about 10 cm, such as about 2 cm to about 10 cm. The active region has a width in the range of about 20 mm to about half the radius of the source, such as about 20 mm to about 45 mm and a length in the range of about 35 mm to about 150 mm, such as about 35 mm to about 100 mm.

Variations and modifications can be made to these exemplary embodiments of the present disclosure. For instance, in a particular embodiment, at least a portion of the gas injection insert can be a dielectric ring portion. In another particular embodiment, the dielectric gas injection insert can be a dielectric tube. In still another particular embodiment, the gas injection insert can include a metal or conductive portion and/or can include a hollow portion that can receive a metal material.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure, including the best mode, to one of ordinary skill in the art, is set forth more particularly in the remainder of the specification, including reference to the accompanying figures, in which.

DETAILED DESCRIPTION

Figure 1:
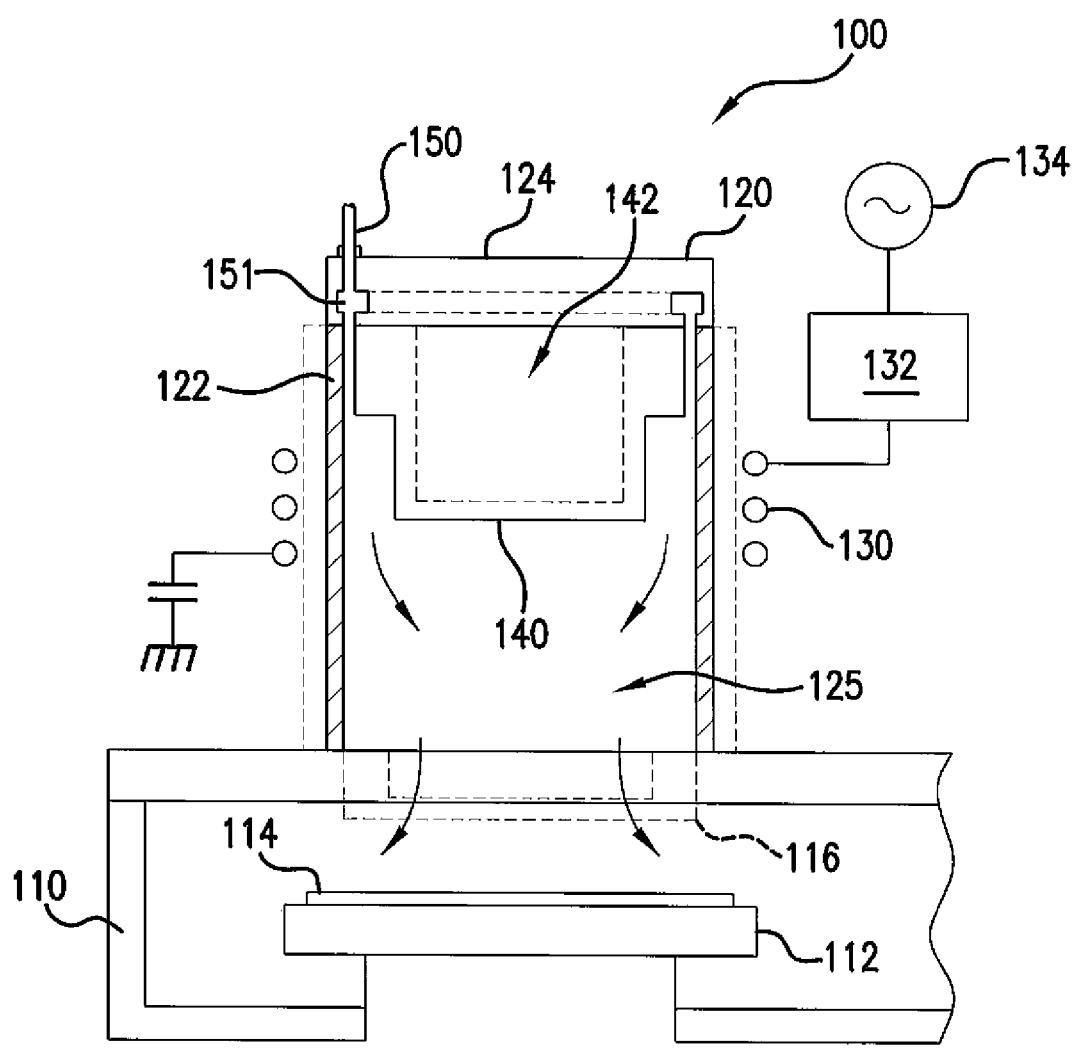
FIG. 1 depicts a plasma reactor according to an exemplary embodiment of the present disclosure.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

Generally, the present disclosure is directed an inductive plasma source with enhanced efficiency of both gas and energy consumption. According to embodiments of the present disclosure, a process gas is fed into a plasma chamber through a gas injection channel located adjacent to the side wall of the plasma chamber, rather than from the center, so that the process gas enters the plasma chamber in close proximity to the induction coil. In particular embodiments, a special reactive zone or active region is created adjacent to both the coil and the gas injection channel, so that the process gas that enters the chamber is forced to pass through this zone with enhanced electron confinement where most of electron heating occurs. As discussed below, this increases the efficiency of the reactor by improving a gas flow pattern and by providing electron confinement in the active region.

For efficient production of process gas, one has to direct the flow through regions with a high density of hot electrons. This is especially important for processes involving simple chemistry where generating the desired species does not require a long chain of collisions, but rather a single collision (e.g. $O_2 \rightarrow 2O$). In such processes only high energy electrons can participate in the generation of the products. The rest of the electrons will take part mainly in gas heating through excitation of rotational and vibrational molecular states. The magnitude of the gas flow through the regions with a high density of electrons should be high enough to produce the necessary amount of products, such as radicals, but not so high that a lot of gas molecules will pass through the region without interaction with the plasma and wasted.

In inductive plasma sources, electrons can gain energy from the electric field in a narrow skin-layer region (about one or two skin layers) adjacent to the induction coil. Only in this small (compared to the chamber) region is the electric field high enough to overcome electron energy losses in collisions with gas atoms and molecules. In the rest of the volume where electric field is absent, electrons can only lose their energy. In low pressure applications, electrons may enter the heating region (skin-layer region) a few times without losing much energy outside the region. Since losses are small until the electrons reach high energy, the heating efficiency is high and the electric field can be relatively small to sustain discharge. In contrast, in high pressure applications, it is highly probable that an electron leaving the skin-layer region will lose all of its energy on low energy molecular excitations and heating before it returns to the skin-layer region. These losses on gas heating reduce efficiency of the discharge and require a high electric field to sustain the discharge. The other cause for reduction of the electron heating efficiency in high pressure plasma could be geometry of the plasma source. For example, in a cylindrical source with a coil wound on a side wall, the azimuthal electric field in the axis of the source is zero, even in the absence of plasma or thick skin layer. Clearly, away from the wall, where the field is weak, hot electrons predominantly loose energy on medium and low energy inelastic collisions, and become cold. To increase source efficiency in a high pressure discharge one has to improve electron confinement in the heating area.

For instance, in a typical plasma source, there is nothing to hold electrons in the skin-layer region proximate the induction coil. The electrons simply diffuse around the volume and sometimes enter the skin-layer region. Electron balance in the volume is supported by ionization in the volume and losses on the walls. For the plasma density in the heating area around $10^{11}$ cm$^{-3}$, and 13.56 MHz RE field, the thickness of the skin layer in collisional plasma is about $\delta_s \sim (c/\omega_{pe})\sqrt{2\nu/\omega} \sim 1 \div 15$ cm, where c is the speed of light, $\omega_{pe}$ is electron plasma frequency, $\nu$ is electron collisional frequency and $\omega$ is the frequency of the RF field. At skin layer depth, the electric field is almost 3 times lower than near the wall, and since high energy processes (ionization, dissociation, . . . ) depend on electric field exponentially—the efficiency of heating of energetic electrons strongly decreases with electric field and effective heating depth $\delta_h$ is even smaller than the skin depth. So for electrons in the middle of the heating volume it takes time $\tau \sim \delta^2/8D$ where D is electron diffusion coefficient, to leave the heating volume. For 1-5 eV electron in 1 Torr of Oxygen the diffusion coefficient is about $(2.5-5.5) \times 10^6$ cm$^2$/s, so for $\delta_h \sim 2$ cm, in about $10^{-7}$ s electron will leave the heating region, which is not enough to gain the about (10-20) eV, necessary for high energy collision. That means that the vast majority of electrons leave the heating area with a relatively small energy, and most of electrical energy is wasted on gas heating through low energy collisions. Only a small fraction of electrons gains enough energy to produce high energy excitations, dissociations and ionizations.

To increase efficiency of a high pressure discharge in a plasma source, embodiments of the present disclosure improve gas flow into the heating area and improve electron confinement in the heating area. FIG. 1 depicts a plasma reactor 100 according to an exemplary embodiment of the present disclosure. As illustrated, plasma reactor 100 includes a processing chamber 110 and a plasma chamber 120 that is separate from the processing chamber 110. Processing chamber 110 includes a substrate holder or pedestal 112 operable to hold a substrate 114, such as a semiconductor wafer. An inductive plasma is generated in plasma chamber 120 and desired particles are channeled from the plasma chamber 120 to the surface of substrate 114 through holes provided in a grid 116 that separates the plasma chamber 120 from the processing chamber 110.

Figure 7:
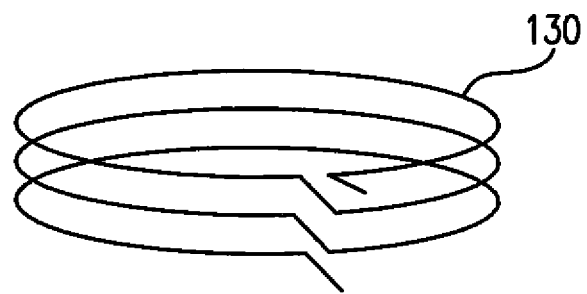
FIG. 7 depicts an exemplary induction coil that can used with a plasma reactor according to an exemplary embodiment of the present disclosure.

The plasma chamber 120 includes a dielectric side wall 122 and a ceiling 124. The dielectric side wall 122 and ceiling 124 define a plasma chamber interior 125. Dielectric side wall 122 can be formed from any dielectric material, such as quartz. An induction coil 130 is disposed adjacent the dielectric side wall 122 about the plasma chamber 120. An exemplary induction coil 130 is illustrated in FIG. 7. Preferably, the coil includes between about two and four turns and is built in such a way that every turn is parallel. To achieve this configuration, a step in the winding at the end of each turn is provided in the induction coil 130 as shown in FIG. 7.

Referring back to FIG. 1, the induction coil 130 is coupled to an RE power generator 134 through a suitable matching network 132. Process gas is provided to the chamber interior from gas supply 150 and annular gas distribution channel 151. When the induction coil 130 is energized with RE power from the RF power generator 134, a substantially inductive plasma is induced in the plasma chamber 120. In a particular embodiment, the plasma reactor 100 can include an optional faraday shield 128 to reduce capacitive coupling of the induction coil 130 to the plasma.

Figure 2:
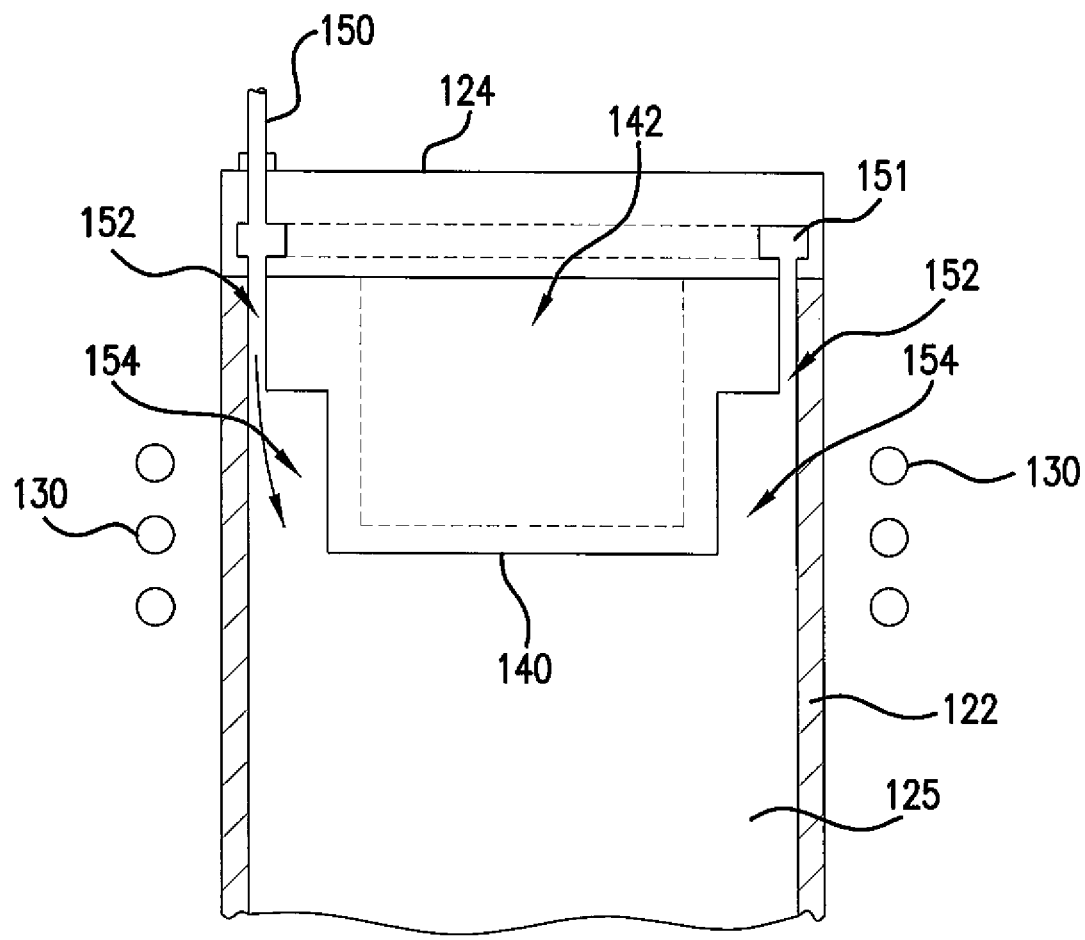
FIG. 2 depicts a plasma chamber of a plasma reactor according to an exemplary embodiment of the present disclosure.

To increase efficiency, the plasma reactor 100 includes a gas injection insert 140 disposed in the chamber interior 125. Gas injection insert 140 can be removably inserted into chamber interior 125 or can be a fixed part of plasma chamber 120. Referring to FIG. 2, the gas injection insert 140 defines a gas injection channel 152 proximate the side wall 122 of the plasma chamber 120. The gas injection channel 152 feeds the process gas into the chamber interior 125 proximate the induction coil 130 and into an active region 154 defined by the gas injection insert 140 and side wall 120. The active region 154 provides a confined region within plasma chamber interior 125 for active heating of electrons. The narrow gas injection channel 152 prevents plasma spreading from the chamber interior 125 into the gas channel. The gas injection insert 140 forces the process gas to be passed through the active region 154 where electrons are actively heated. Separation of the active region 154 from the center of the plasma chamber interior 125 has positive effect because the electric field in the center of the plasma chamber interior 125 is absent even without screening.

The gas injection insert 140 provides improved electron confinement in the active region 154 by reducing the area of escape of the electrons to only one exit. In particular, the gas injection insert 140 provides a wall that works in conjunction with the side wall 122 of the plasma chamber 120 to surround the active region 154 on all sides except for one. Surrounding the active region 154 from all sides except one allows a plasma sheath near the walls to reflect electrons. In a particular embodiment, the wall of the gas injection insert 140 can be a reflective wall configured to enhance reflection of the electrons. If the additional wall provided by the gas injection insert 140 is within about one to two skin layers from the side wall 122, electrons can bounce between walls and stay continuously in the active region 154 until they exit through the only open side of the active region 154 or until the electron gains very high energy and velocity towards the wall that it overcomes the sheath barrier. This makes heating of the electrons in the active region much more efficient. In addition, as long as ion confinement is good in the active region 154, the electron losses to the wall of the gas injection insert can be neglected.

The capabilities of the gas injection insert 140 to improve efficiency of the plasma reactor 100 are independent of the material of the gas injection insert 140 as long as the walls that are in direct contact with the radicals are made of material with a low recombination rate for the radicals. For instance, in a particular embodiment, the gas injection insert 140 can be made from an aluminum material with a coating configured to reduce surface recombination. Alternatively, the gas injection insert 140 can be a quartz material or insulative material.

In certain embodiments, however, the gas injection insert 140 can play an active role in reducing the transition time between an ignition phase and a process phase for the plasma reactor. During ignition of the plasma, the load to match the RF power supply 134 differs significantly from the load during operation. As a result, there can be large reflected power, high voltage on electrodes, etc. Normally, this limits the power during ignition and also requires lower pressure and gas flow during ignition.

Typically, abrupt changes from parameters (e.g. power, pressure, and gas flow) required during the ignition phase to those required for the process phase can cause unstable process conditions with pressure and power oscillations. To obtain a smooth and stable transition from the ignition phase to a process phase, a transition step is typically required with intermediate power, gas flow, and pressure. This transition step typically takes a couple of seconds. Moreover, even at the end of the transition step, parameters are still different from those required during the process phase. Thus, actual transition can take even longer. This delay may significantly reduce productivity of the plasma source as it adds significant additional time to the process.

The material of the gas injection insert 140 can reduce the time required for the transition step or even eliminate the transition step altogether. More particularly, when plasma is present in the plasma chamber 120, the induction coil 130 is coupled to the plasma and it does not matter whether the gas injection insert 140 is made of a metal material or a dielectric material. However, during the ignition step, the induction coil 130 is not coupled to any load, so reflected power is high and the high voltages on the components prevent application of high power during the ignition stage. If the gas injection insert 140, however, comprises a metal material, the metal of the gas injection insert 140 will imitate a plasma load during the ignition stage. The induction coil 130 will be coupled to the quasi-load provided by the metal of the gas injection insert 140 so that reflected power is small and higher powers can be applied to the induction coil 130. As the plasma ignites and increases its density, the induction coil 130 will naturally couple to the plasma and screen the gas injection insert 140 from the field.

For certain processes, it may be undesirable to make the gas injection insert 140 out of a metal material if direct contact between metal and plasma is undesirable. In this case, the gas injection insert can include a dielectric material having a hollow portion 142 as illustrated in FIG. 2. A metal can be placed in the hollow portion 142 to serve as the quasi-load during the ignition stage. The hollow portion 142 also allows easy access for cooling.

Figure 3:
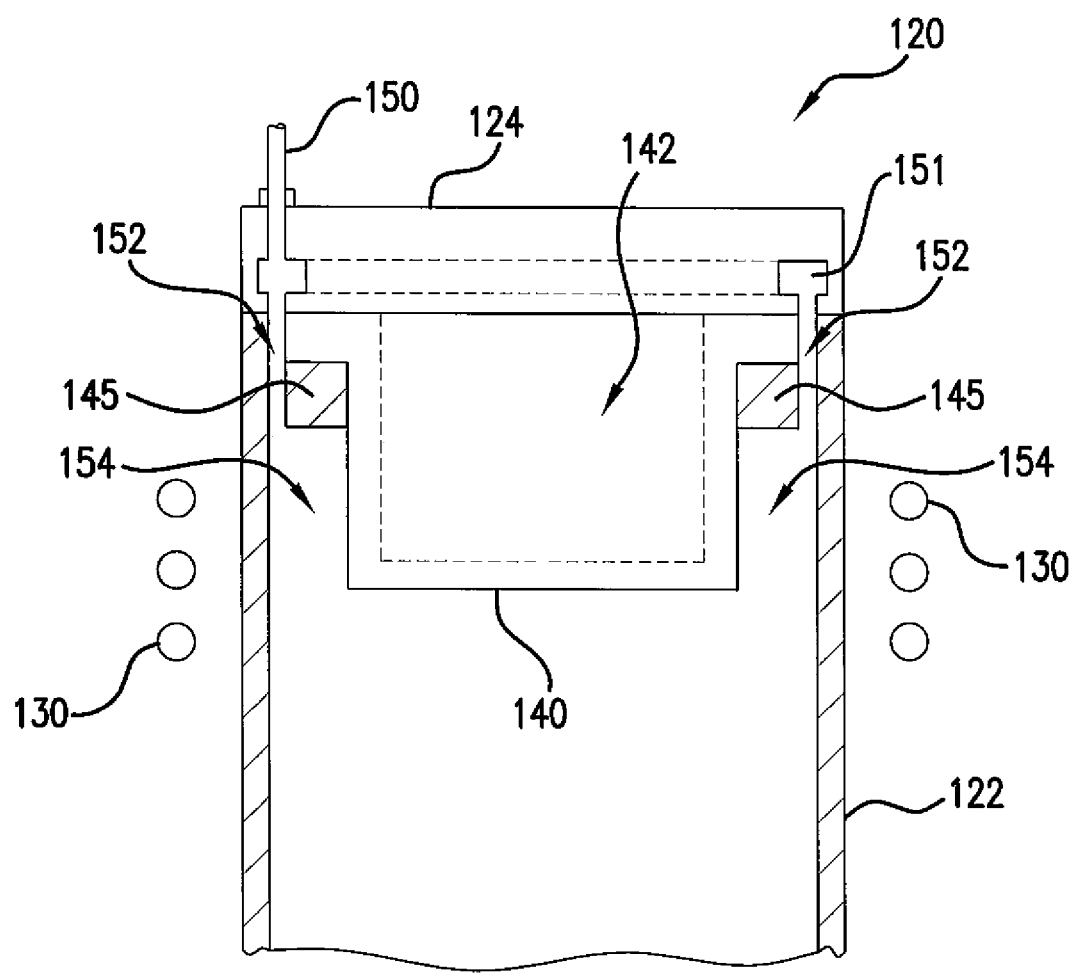
FIG. 3 depicts a plasma chamber of a plasma reactor according to an another exemplary embodiment of the present disclosure.
Figure 4:
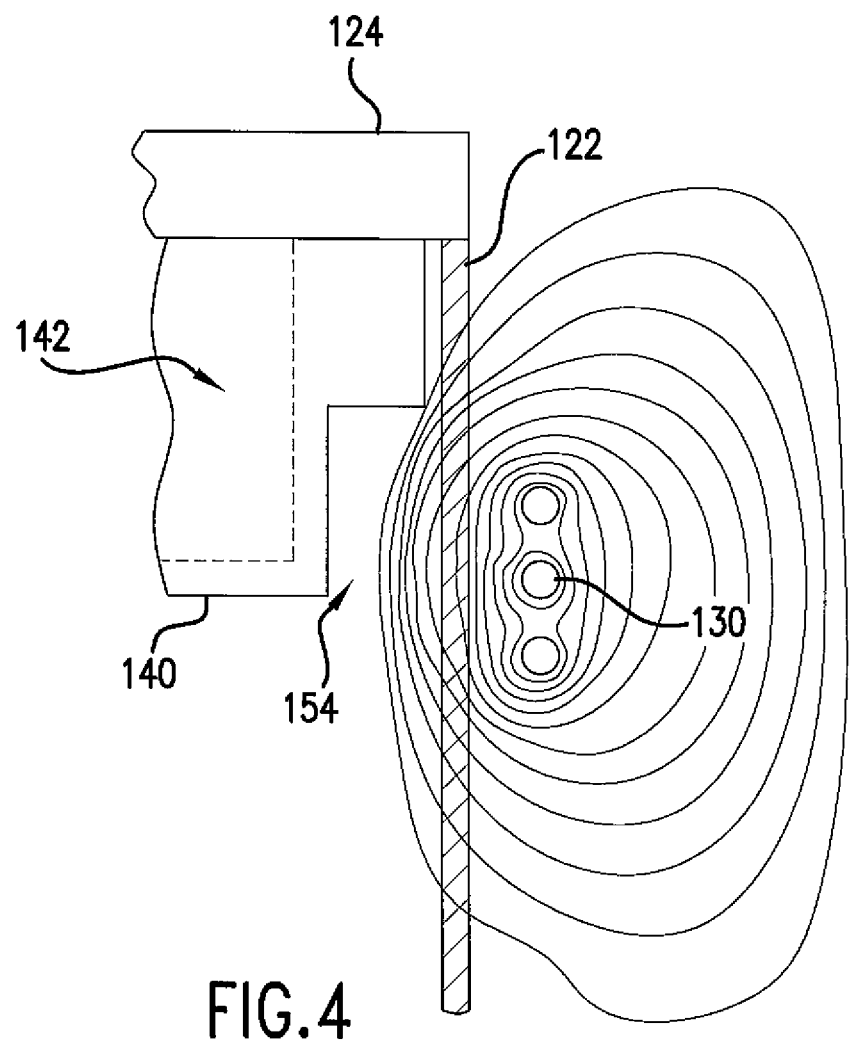
FIG. 4 depicts the magnetic flux lines associated with an induction coil of the plasma chamber depicted in FIG. 2.
Figure 5:
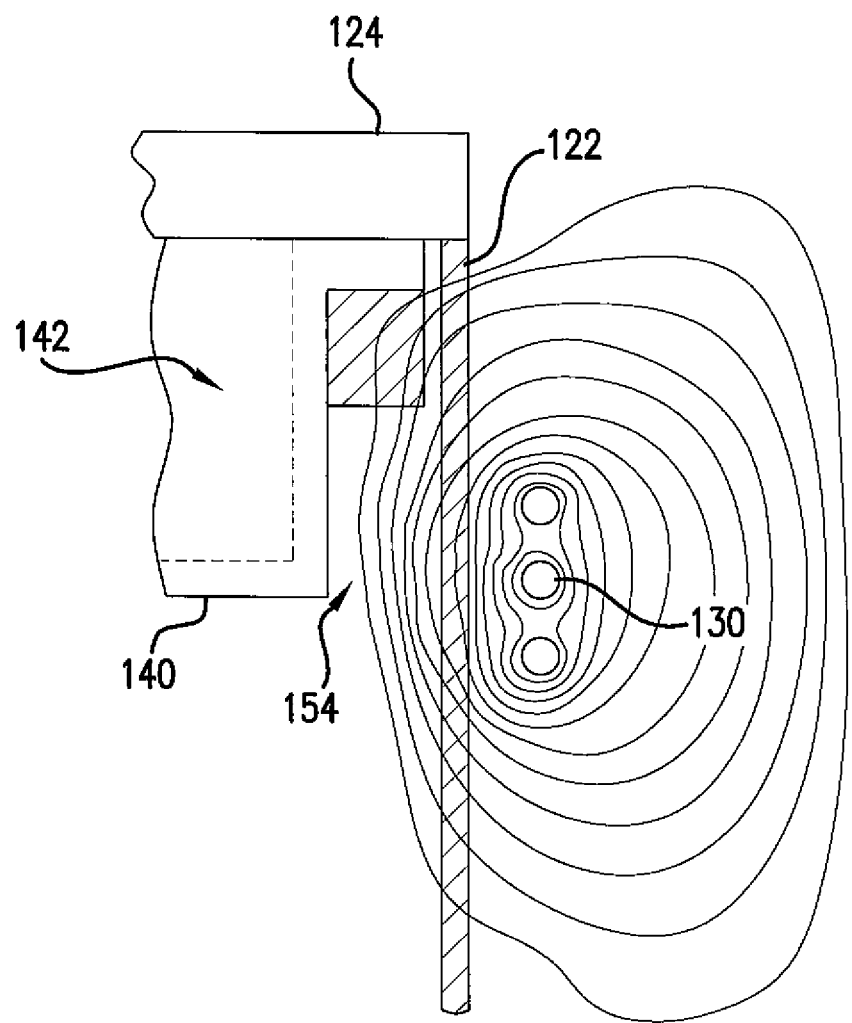
FIG. 5 depicts the magnetic flux lines associated with an induction coil of the plasma chamber depicted in FIG. 3.

FIG. 3 depicts a plasma chamber 120 according to another embodiment of the present disclosure. In the plasma chamber 120 of FIG. 3, a portion of the gas injection insert 140 includes a dielectric ring portion 145. The dielectric ring portion 145 can be made from a dielectric material such as quartz. The dielectric ring portion 145 increases the magnetic field penetration into the active region 154 without changing the geometry of the region and gas flow pattern. FIG. 4 illustrates qualitatively the magnetic field lines associated with the plasma chamber 120 having a gas injection insert 140 without the dielectric ring portion 145 and with account for plasma skin depth. FIG. 5 illustrates the magnetic field lines associated with the plasma chamber 120 having a gas injection insert 140 with a dielectric ring portion 145 in the same conditions as in FIG. 4. As illustrated, the dielectric ring portion 145 increases the magnetic field penetration into the active region 154 of the plasma chamber 120, thus increasing the efficiency of the plasma source.

Figure 6:
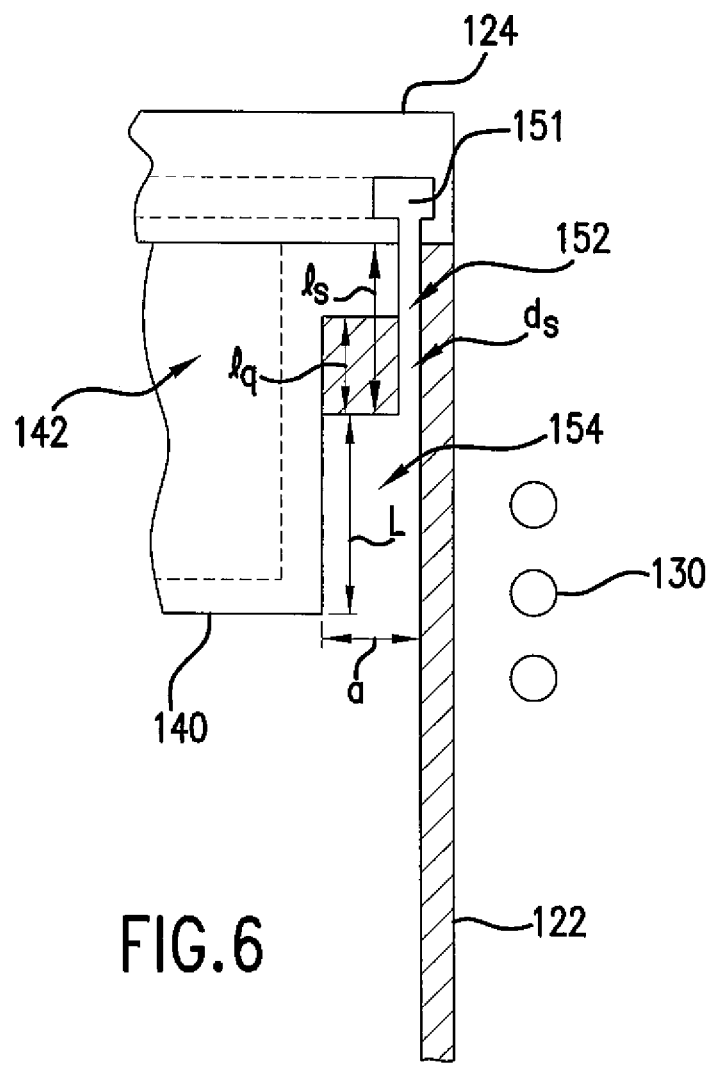
FIG. 6 depicts a close up view of the plasma chamber depicted in FIG. 3.

FIG. 6 illustrates a portion of the plasma source 120 of FIG. 3 according to an exemplary preferred embodiment of the present disclosure. According to this embodiment, the gas injection channel 152 has a length $l_s$ of about 2 cm to about 10 cm and a width $d_s$ of 1 mm to about 3 mm. The active region 154 has a width a of about 25 mm to about 65 mm, such as about 20 mm to about 45 mm and a length L of about 35 mm to about 150 mm, such as about 35 mm to about 100 mm. The gas injection insert 140 includes a dielectric ring portion 144 having a length $l_q$ in the range of about 0 cm to about 10 cm, such as about 0.5 cm to about 10 cm.

With the particular geometry of the gas injection provided by embodiments of the present disclosure, the ratio of gas flow to gas pressure can be used for an active control of the process profile on a semiconductor wafer. To improve gas utilization efficiency one needs to direct gas molecules into the active region and let them stay there for the time required to collide with hot electrons, so that the gas resident time in the active region ($\tau_{res}$) is about the time for large energy inelastic collision ($\tau^*_{coll}$). Partially creating the walls around electron heating area with a gas injection insert addresses this problem because these walls hold gas and the gas injection channel feeds the gas into that zone. As plasma parameters are determined mostly by ion losses to sidewalls, and thus by a transverse dimension of the channel a, the gas molecule collision time with electrons mostly depends on the power $P_{in}$, pressure p and the dimension a, while the resident time by the gas flow $\Phi$, volume of the heating area $V^a (V_a = 2\pi RaL$, where R is the average radius of the zone, L the length of the zone), and gas pressure $\tau_{res} \sim pV_a/(\Phi T)$, where T is the gas temperature. Changing the gas flow or the length of the area, one can adjust the resident time to be close to $\tau^*_{coll}$, so that one can get efficient utilization of both electric energy and gas.

In view of the foregoing, one can use the ratio of gas flow to gas pressure $\Phi/p$ for an active control of the process profile on the wafer. Indeed, if this ratio is low, then the gas entering the main volume quickly mixes with the rest of the gas so that the gas flow profile near the wafer mostly depends on the gas pressure and gas flow, but not on the details of gas injection, so the process profile on the wafer will be always center-fast. On the other hand, if this ratio is high then the gas flow in the chamber "remembers" the injection geometry far from the injection point, so the process profile strongly depends on the injection profile and is edge-fast with respect to the injection geometry of the present disclosure. Thus, one can adjust the ratio $\Phi/p$ and obtain a desirable (edge-fast/flat/center-fast) profile. This dynamic process profile control allows one to use a simple uniform grid for processes where the presence of plasma near the wafer is undesirable (e.g. dry strip) and one has to separate plasma from radicals.

Figure 8:
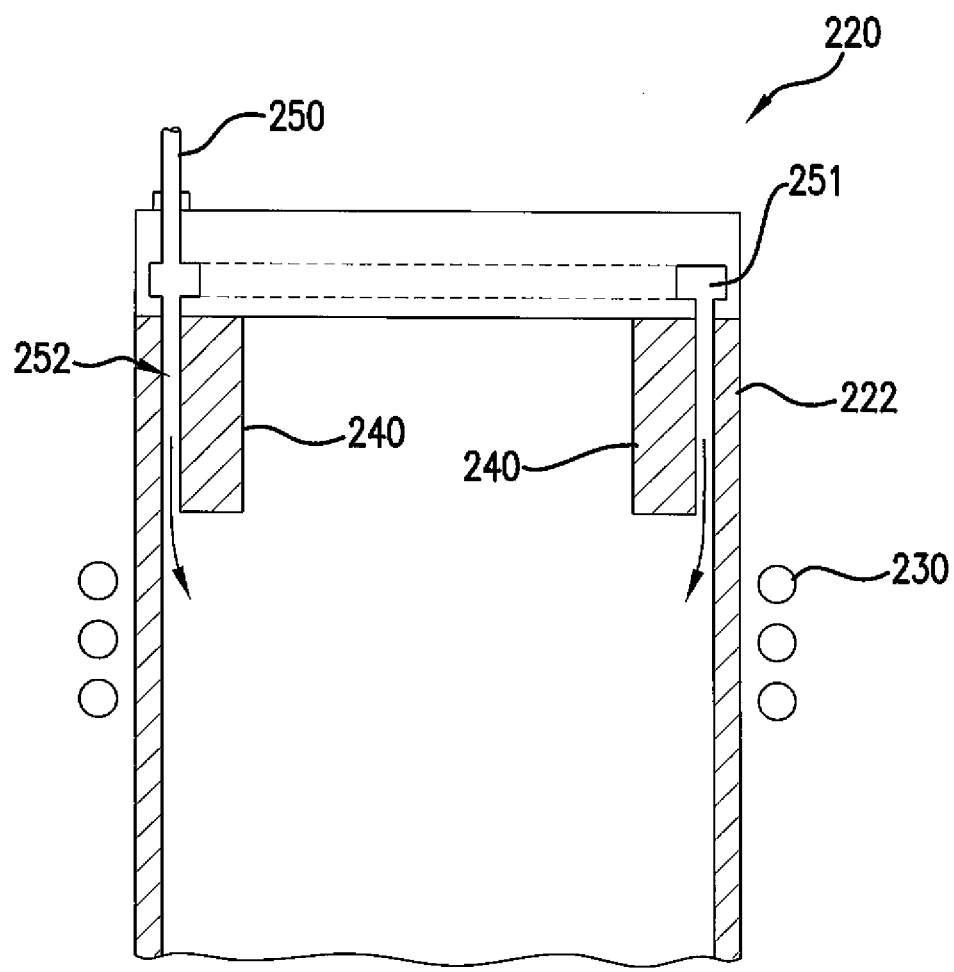
FIG. 8 depicts a plasma chamber of a plasma reactor according to another exemplary embodiment of the present disclosure.

In an alternate embodiment of the present disclosure, the gas injection insert can be a simple tube made of quartz, metal, or insulative material that extends the gas injection point down to or near the induction coil. For instance, FIG. 8 illustrates a plasma chamber 220 having dielectric sidewalls 222 and defining a chamber interior 225. The plasma chamber 220 includes a dielectric tube insert 240. The dielectric tube insert extends the gas injection channel 252 from gas supply 250 and annular gas distribution channel 251 to an area proximate induction coil 230. This particular embodiment has many of the advantages discussed above and, because the insert 240 is inexpensive and light weight, can be easily added to existing reactors.

These and other modifications and variations to the present invention may be practiced by those of ordinary skill in the art, without departing from the spirit and scope of the present invention, which is more particularly set forth in the appended claims. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A plasma reactor for processing a substrate, comprising:
   a processing chamber having a substrate holder operable to hold the substrate;
   a plasma chamber separate from said processing chamber for generating a plasma to be used in processing the substrate, said plasma chamber having a ceiling and a dielectric side wall defining a plasma chamber interior;
   an induction coil adjacent said plasma chamber about said dielectric side wall; and
   a stepped gas injection insert disposed within the plasma chamber interior;
   wherein said stepped gas injection insert and said side wall define a narrow gas injection channel adjacent said dielectric side wall for providing a process gas to said plasma chamber interior proximate said induction coil, the gas injection insert further defining an active region adjacent to the induction coil for heating of electrons, the gas injection channel providing the process gas to the active region, the gas injection channel being disposed above the active region and having a smaller width than the active region.

2. The plasma reactor of claim 1, wherein the gas injection insert comprises a metal material.

3. The plasma reactor of claim 1, wherein the gas injection insert comprises a dielectric material.

4. The plasma reactor of claim 1, wherein the gas injection insert comprises a hollow portion.

5. The plasma reactor of claim 1, wherein the gas injection insert comprises a dielectric ring portion, the dielectric ring portion defining at least a portion of the gas injection channel.

6. The plasma reactor of claim 1, wherein the gas injection channel has a length in the range of about 2 cm to about 10 cm.

7. The plasma reactor of claim 1, wherein the gas injection channel has a width of about 1 mm to about 3 mm.

8. The plasma reactor of claim 1, wherein the active region has a width in the range of about 20 mm to about 45 mm and a length in the range of about 35 mm to about 100 mm.

9. A method for generating a plasma for processing a substrate, comprising:

placing a substrate in a processing chamber, the processing chamber separate from a plasma chamber for generating a plasma to be used in processing the substrate;

energizing an induction coil located adjacent a dielectric sidewall of the plasma chamber to generate a substantially inductive plasma in a plasma chamber interior; and providing process gas to the plasma chamber interior proximate the induction coil through a gas injection channel defined by the sidewall of the plasma chamber and a stepped gas injection insert disposed in the plasma chamber interior, wherein the gas injection insert further defines an active region adjacent to the induction coil for heating of electrons, the gas injection channel providing the process gas to the active region, the gas injection channel being disposed above the active region and having a smaller width than the active region.

10. The method of claim 9, wherein the gas injection insert comprises a dielectric ring portion.

11. The method of claim 9, wherein the gas injection insert comprises a hollow portion.

12. The method of claim 9, wherein the gas injection insert comprises a metal.

13. The method of claim 9, wherein the gas injection channel has a length in the range of about 2 cm to about 10 cm and a width in the range of about 1 mm to about 3 mm.

14. The method of claim 9, wherein the active region has a width in the range of about 20 mm to about 45 mm and a length in the range of about 35 mm to about 100 mm.

15. A plasma reactor for processing a substrate, comprising:

a processing chamber having a substrate holder operable to hold the substrate;

a plasma chamber separate from said processing chamber for generating a plasma to be used in processing the substrate, said plasma chamber having a ceiling and a dielectric, side wall defining a plasma chamber interior;

an induction coil adjacent said plasma chamber about said dielectric side wall; and a stepped gas injection insert disposed within the plasma chamber interior, said gas injection insert and said side wall defining a gas injection channel adjacent said dielectric side wall for providing a process gas to said plasma chamber interior proximate said induction coil, the gas injection insert further defining an active region with enhanced electron confinement adjacent the induction coil, the gas injection channel providing the process gas to the active region adjacent the induction coil, the gas injection channel being disposed above the active region and having a smaller width than the active region;

wherein the gas injection channel has a width in the range of about 1 mm to about 3 mm and length in the range of about 2 cm to about 10 cm, and the active region has a width in the range of about 20 mm to about 45 mm and a length in the range of about 35 mm to about 100 mm.

16. The plasma reactor of claim 15, wherein the gas injection insert comprises a dielectric ring portion.

17. The plasma reactor of claim 16, wherein the dielectric ring portion has a length in the range of about 0.5 cm to about 10 cm.

\* \* \* \* \*